United States Patent [19]

Suzuki

[11] Patent Number: 5,119,466

[45] Date of Patent: Jun. 2, 1992

[54] CONTROL MOTOR INTEGRATED WITH A DIRECT CURRENT MOTOR AND A SPEED CONTROL CIRCUIT

[75] Inventor: Akihiko Suzuki, Kosai, Japan

[73] Assignee: Asmo Co., Ltd., Kosai, Japan

[21] Appl. No.: 525,688

[22] Filed: May 21, 1990

[30] Foreign Application Priority Data

| May 24, 1989 | [JP] | Japan | 1-131166 |
| May 24, 1989 | [JP] | Japan | 1-131167 |
| May 24, 1989 | [JP] | Japan | 1-131168 |
| May 31, 1989 | [JP] | Japan | 1-137657 |

[51] Int. Cl.⁵ .................. H02K 11/00; H05K 7/20
[52] U.S. Cl. .................. 388/831; 310/68 R; 310/DIG. 6
[58] Field of Search .......... 318/138, 254, 439, 558, 318/599; 310/68 R, DIG. 6; 388/830, 831

[56] References Cited

U.S. PATENT DOCUMENTS

| 3,364,407 | 1/1968  | Hill           | 318/480 X    |
| 3,509,438 | 4/1970  | Kachuk         | 318/254 X    |
| 3,909,679 | 9/1975  | Petri          | 317/100      |
| 4,385,276 | 5/1983  | Bitzel         | 324/174      |
| 4,472,649 | 9/1984  | Namba et al.   | 310/68 D     |
| 4,554,473 | 11/1985 | Muller         | 310/67 R     |
| 4,668,898 | 5/1987  | Harms et al.   | 310/68 R X   |
| 4,724,347 | 2/1988  | Reinhardt et al. | 310/DIG. 6 |
| 4,779,031 | 10/1988 | Arends et al.  | 318/685 X    |
| 4,940,041 | 7/1990  | Riedmaier et al. | 126/110 R |
| 4,973,158 | 11/1990 | Marsh          | 356/247      |

FOREIGN PATENT DOCUMENTS 2061020  5/1981  United Kingdom ............ 310/68 R

Primary Examiner—Bentsu Ro
Attorney, Agent, or Firm—Burns, Doane, Swecker & Mathis

[57] ABSTRACT

A control motor comprising an integrated direct current motor and speed control circuit, the speed control circuit controlling a rotational speed of the direct current motor by means of changing a voltage applied to an armature by a chopping of a switching element, the speed control circuit being composed upon a printed circuit board, the printed circuit board being supported in the direct current motor by a case member formed of a heat-conducting material, and a radiation portion of the switching element which is closely contracted with a projection formed integrally with the case member and is installed in the projection.

7 Claims, 15 Drawing Sheets

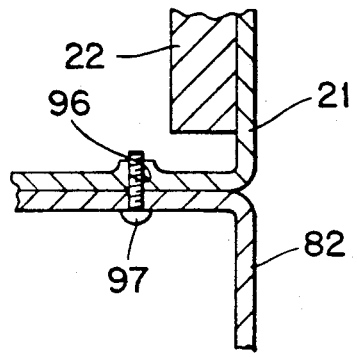
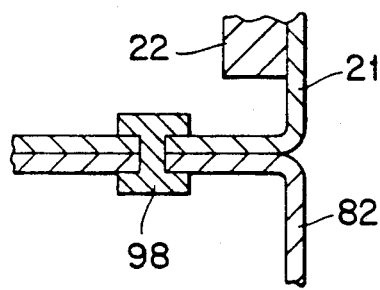
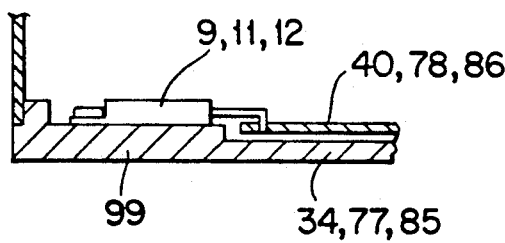
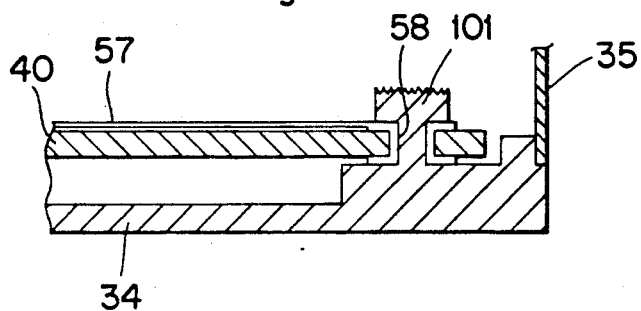
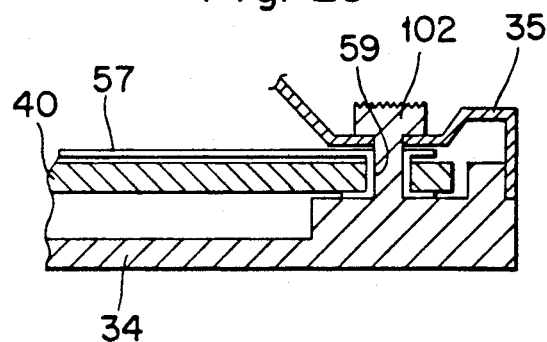
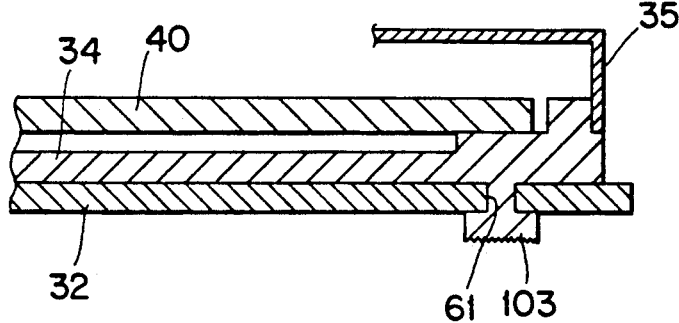

CONTROL MOTOR INTEGRATED WITH A DIRECT CURRENT MOTOR AND A SPEED CONTROL CIRCUIT

BACKGROUND OF THE INVENTION

The invention relates to a control motor comprising an integrated direct current motor and speed control circuit and, more particularly to a control motor which is suitable for use as a blower motor provided in a vehicle air conditioner and an electrically-driven fan motor for cooling a radiator.

In the vehicle air conditioner a rotational speed of the blower motor is controlled in order to regulate air flow blown in a vehicle compartment.

In some of the speed control circuits of this kind, the rotational speed of the blower motor is controlled linearly by a power transistor. The advantage of linear control is that little noise is generated; the disadvantage to linear control, however, is that heat is generated in the power transistor. The Japanese Patent Application No. 235114 of 1988 discloses an intake unit 110, in which a switching element 113 installing a heat sink 112 is positioned near a scroll 111 of the intake unit 110 to radiate the heat, as illustrated in FIGS. 29 and 30.

The Japanese Patent Application No. 235114 of 1988 also discloses the intake unit 110, in which a voltage is controlled by a chopping performed by a pulse width modulation control (PWM control) to control generation of heat in the speed control circuit and a power MOSFET generating only a little heat is used as the switching element. In such a motor as disclosed in the Japanese Patent Application No. 235114 of 1988, there is a relatively little heat generated in the speed control circuit and radiating the heat is easy, therefore the speed control circuit is placed in a motor bracket to be formed integrally with the direct current motor, leading to an easy installation of the direct current motor. This control motor comprised of the integrated direct current motor and the speed control circuit is referred to as a smart motor or an intelligent motor.

The speed control performed by the chopping has a disadvantage in that radio frequency noise is generated by the speed control circuit. In a motor loaded into the vehicle a power source is a battery and the voltage is low. Further, in a large motor, a high current of more than 30A must be switched. In this switching, a float inductance and a float capacitance of the speed control circuit produce a voltage and a current oscillation of a far higher frequency than the switching frequency, generating radio frequency noise. The radio frequency noise may conduct to other electronic apparatuses connected with the same battery with the radio via the power line, producing harmful influences such as faulty operation of a microcomputer. Further, the noise is radiated directly as an electromagnetic wave, exerting a harmful influence on electronic apparatuses provided in a periphery of the radio. Also, the noise intrudes from an antenna of a radio loaded in a vehicle, preventing receipt of the radio frequency from a broadcasting station. In a conventional control motor having a speed control function and using a high current, no consideration was given to the above radio noise.

SUMMARY OF THE INVENTION

An object of the invention is to provide a control motor comprising an integrated direct current motor and a speed control circuit which reduces the radio frequency noise generated by switching.

Another object of the invention is to provide a control motor comprising an integrated direct current motor and a speed control circuit which improves the radiation of heat produced by a switching element.

To attain the above objects, as illustrated in FIG. 1, there is provided in the invention the control motor comprising an integrated direct current motor and speed control circuit, the speed control circuit controlling a rotational speed by changing a voltage applied to an armature by a chopper, the control motor characterized in that a printed-circuit board 40, upon which is composed the speed control circuit is supported in the direct current motor by a lower case member 34 formed of a material which conducts heat and electricity well and a radiation portion of a switching element 9 is closely contacted with a projection 41 formed integrally with the lower case member 34 and is installed in the projection 41.

It is desired, as illustrated in FIGS. 8 and 9, that the printed circuit board 40 have through-hole conductors 58 and 59 conducting to a ground pattern 57 and the printed circuit board to be installed in the lower case member 34 by a conductive metallic installing means of screws 36 and 37 or a rivet inserted into the through-hole conductors 58 and 59.

Further, it is desired, as illustrated in FIG. 10, FIG. 21, and FIG. 22, that the lower case member 34 be kept conducting electrically to the ground pattern 57 and be fixed in a yoke of the direct current motor 5 by a metallic fixing means of screws 60 and 97 or a rivet 98.

In the control motor comprising a direct current motor and speed control circuit which is constructed as above, the lower case member 34 is formed of the material which conducts heat and electricity well. Therefore, the lower case member 34 formed integrally with the projection 41 performs a function of a heat sink for the switching element 9. Also, because the lower case member 34 is formed of the material which conducts heat and electricity well, the lower case member 34 also performs a function of an electromagnetic shield which shields electromagnetic noise generated by the printed circuit board 40.

In the control motor in which the printed circuit board 40 is installed by the through-hole conductors 58 and 59, grounding and securing the lower case member 34 is facilitated and the electromagnetic shield function of the lower case member is heightened.

In the control motor in which the lower case member 34 is fixed in the yoke of the direct current motor by the metallic fixing means of the screws 60 and 97 or the rivet 98, the electromagnetic shield function of the direct current motor yoke is heightened by grounding the direct current motor yoke.

Other and further objects, features and advantages of the invention will become appear more fully from the following description.

BRIEF DESCRIPTION OF THE DRAWINGS

FIG. 1 is a perspective view illustrating the control motor without an upper case member.

FIG. 2 is a circuit diagram of the control motor.

FIG. 3 is a front view of the control motor, the control motor being partially broken away.

FIG. 4 is a plan view illustrating the control motor without the upper case member.

FIG. 5 is an exploded view in perspective of a connection portion between a driving field effect transistor, a free-wheel diode and a motor terminal of the control motor.

FIG. 6 is a front view illustrating a connection portion between a free wheel diode and a metal plate.

FIG. 7 is a plan view illustrating the connection portion between the free wheel diode and the metal plate.

FIGS. 8, 9 and 10 are sectional views taken on VIII—VIII line, IX—IX line, X—X line of FIG. 4, respectively.

FIG. 11 is a sectional view illustrating the first embodiment of the invention where the motor is in an air conditioner.

FIG. 12 is a waveform chart for explaining an actuation of the motor of the first embodiment.

FIGS. 13 to 16 are frequency characteristic views illustrating radio noise by comparing first and second comparison example with the first embodiment.

FIGS. 17 to 28 illustrate other embodiments.

FIG. 17 (a) is a front view illustrating a second embodiment in which another unit is equipped with the motor of the invention.

FIG. 17 (b) is a bottom view illustrating the second embodiment.

FIG. 18 is a front view illustrating a third embodiment in which a radiator is equipped with the motor of the invention.

FIG. 19 is a vertical sectional view illustrating the motor of a fourth embodiment.

FIG. 20 is a vertical sectional view illustrating a fifth embodiment.

FIGS. 21 to 22 are sectional views illustrating a portion installing a lower case member in a motor yoke in embodiments six and seven.

FIG. 23 is a sectional view illustrating a portion installing a switching element in the printed circuit board in an eighth embodiment.

FIGS. 24 to 26 are sectional views illustrating portions installing the lower case members and the print-circuit boards in ninth, tenth and eleventh embodiments, respectively.

FIGS. 27 and 28 are sectional views illustrating portions installing the lower case member and the motor yoke in twelfth and thirteenth embodiments, respectively.

DETAILED DESCRIPTION OF THE PREFERRED EMBODIMENT

Referring now to drawings, a first embodiment of the invention is explained.

Figure 2:
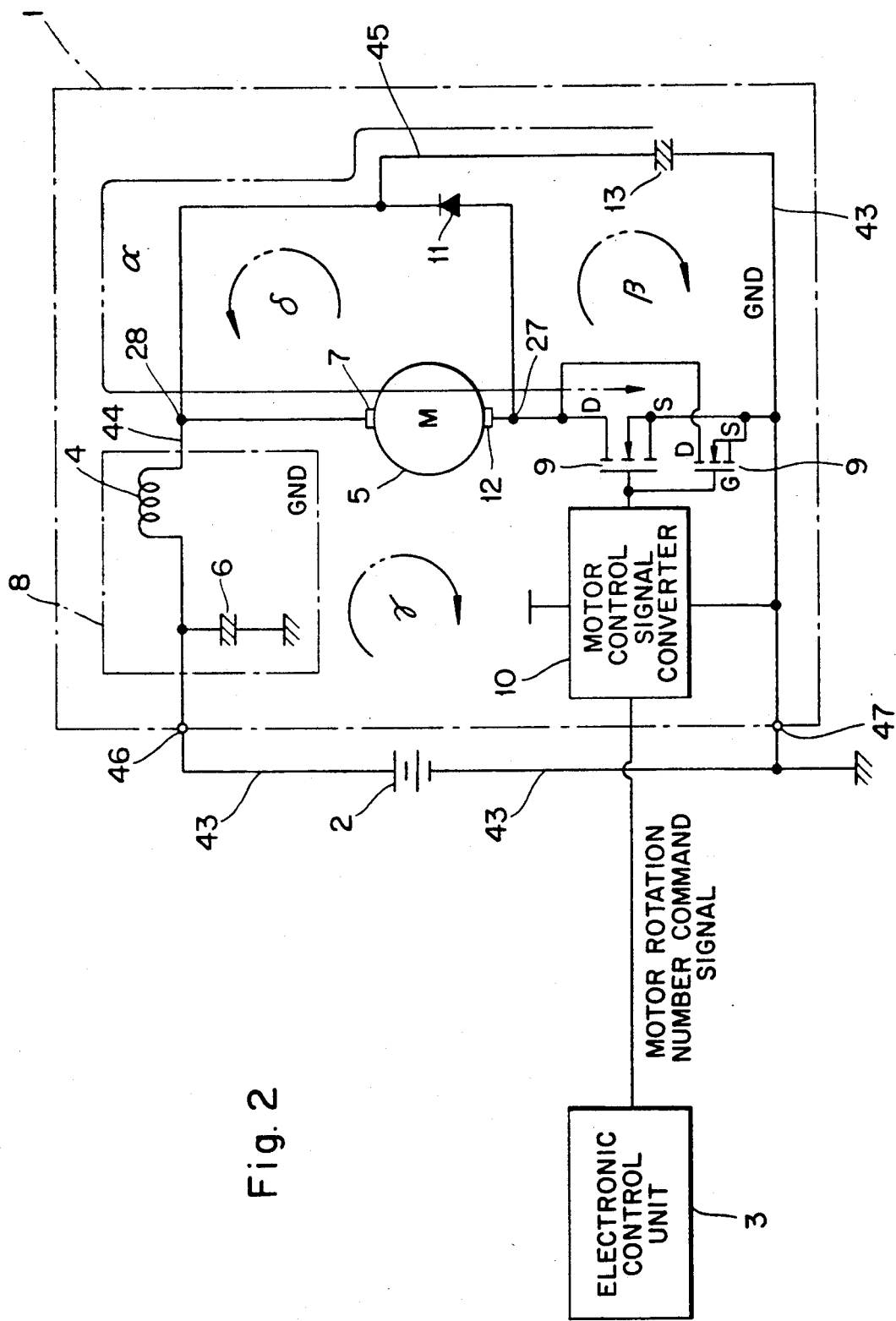

FIG. 2 is a circuit diagram showing a control motor comprising an integrated direct current motor and speed control circuit, which is referred to as a smart motor. The smart motor 1 is loaded into a vehicle and is used to drive a fan of a vehicle air conditioner. The smart motor 1 provides the speed control circuit which controls its rotational speed by means of receiving a direct current voltage supplied by a battery 2 in the vehicle and a motor rotation command signal generated from an electronic control unit (ECU).

A positive pole of the battery 2 whose negative pole is grounded is connected with a positive brush 7 of the direct current motor 5 via a power input terminal 46, an inductance coil 4, and a motor terminal 28. An electrolytic condenser 6 is connected between the battery side of the inductance coil 4 and a ground line GND 43 to compose a LC filter circuit 8 of a power input portion. A negative brush 12 of the direct current motor 5 is connected with a drain D of a driving power MOS field effect transistor 9 (hereinafter referred to as a driving FET 9) via the motor terminal 27. A source S of the driving FET 9 is connected with the ground line GND and is connected with a negative pole of the battery 2 via the motor terminal 27. The negative pole of the battery 2 is grounded. The driving FET 9 acts as a switching element which switches on and off a current flowing in the direct current motor 5. A gate G of the driving FET 9 is connected with a motor control signal converter 10. In the motor control signal converter 10, a gate signal whose pulse width is modulated is outputted to the driving FET 9 according to the motor rotation number command signal generating from the electronic control unit 3 provided outside the smart motor 1. In FIG. 2 a field magnet is abbreviated.

The positive brush 7 and the negative brush 12 of the direct current motor 5 are connected via a free-wheel diode 11 (hereinafter referred to as a FW diode 11). The negative brush 12 is connected with an anode of the FW diode 11. A cathode of the FW diode 11 is connected with the positive brush 7 via the motor terminal 28. A high capacity electrolytic condenser 13 is connected between the cathode of the FW diode 11 and the ground line GND.

An actuation of the speed control circuit of the smart motor 1 is briefly explained. When the electronic control unit (ECU) 3 provided outside the smart motor 1 sends the motor rotation number command signal to the motor control signal converter 10, the motor control signal converter 10 sends the gate signal whose pulse width is modulated (PWM) to the driving FET 9. The driving FET 9 controls the rotational speed of the direct current motor 5 by means of chopping the current flowing from the battery 2 and changing the voltage applied to the armature of the direct current motor 5. When the driving FET 9 is OFF, the armature current flows through the FW diode 11.

In a first embodiment the above speed control circuit is formed integral with the direct current motor 5, so that various noises which accompany switching of the high current are reduced.

Figure 1:
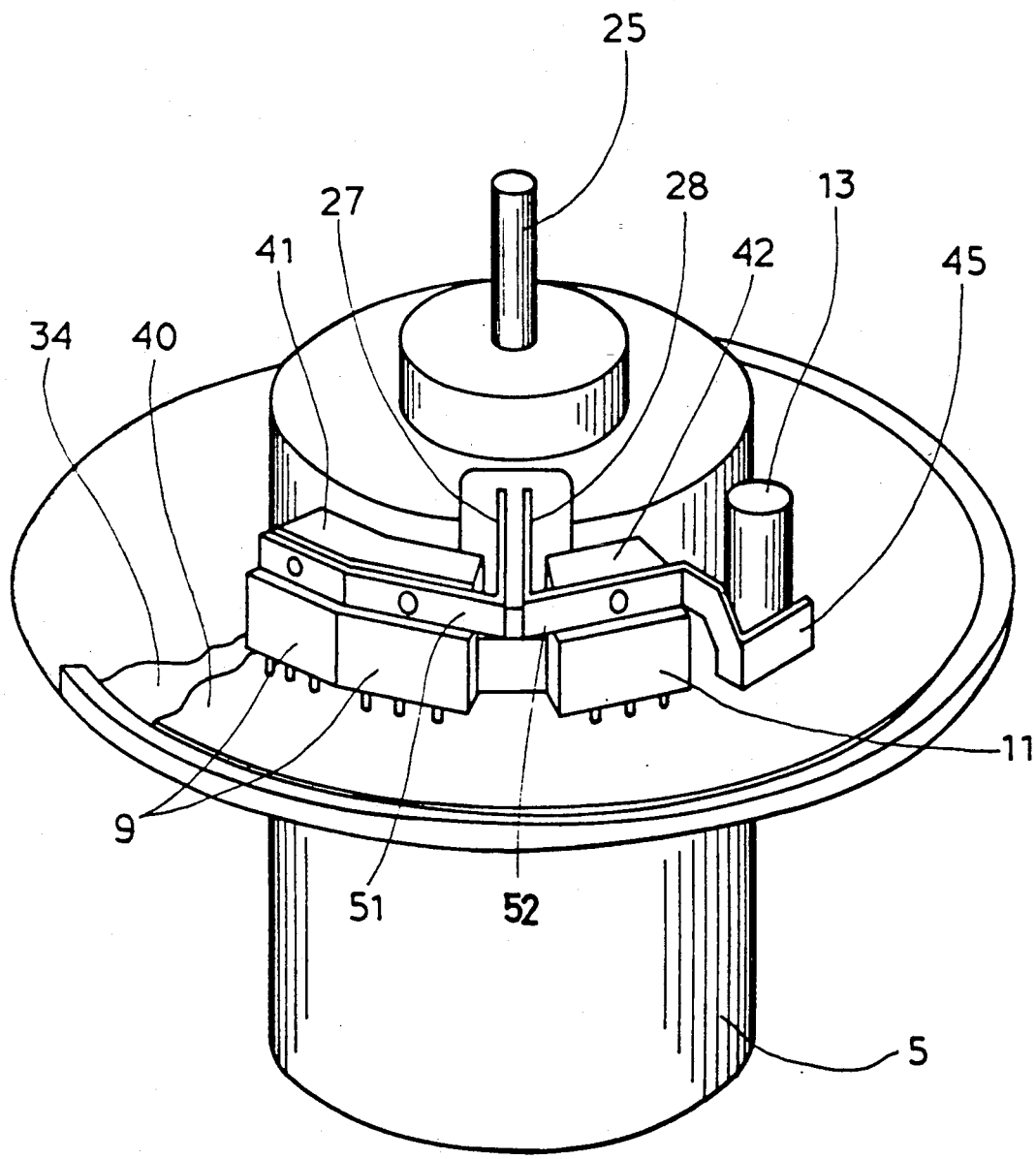
FIGS. 1 to 16 illustrate a first embodiment of a control motor of the invention.
Figure 3:
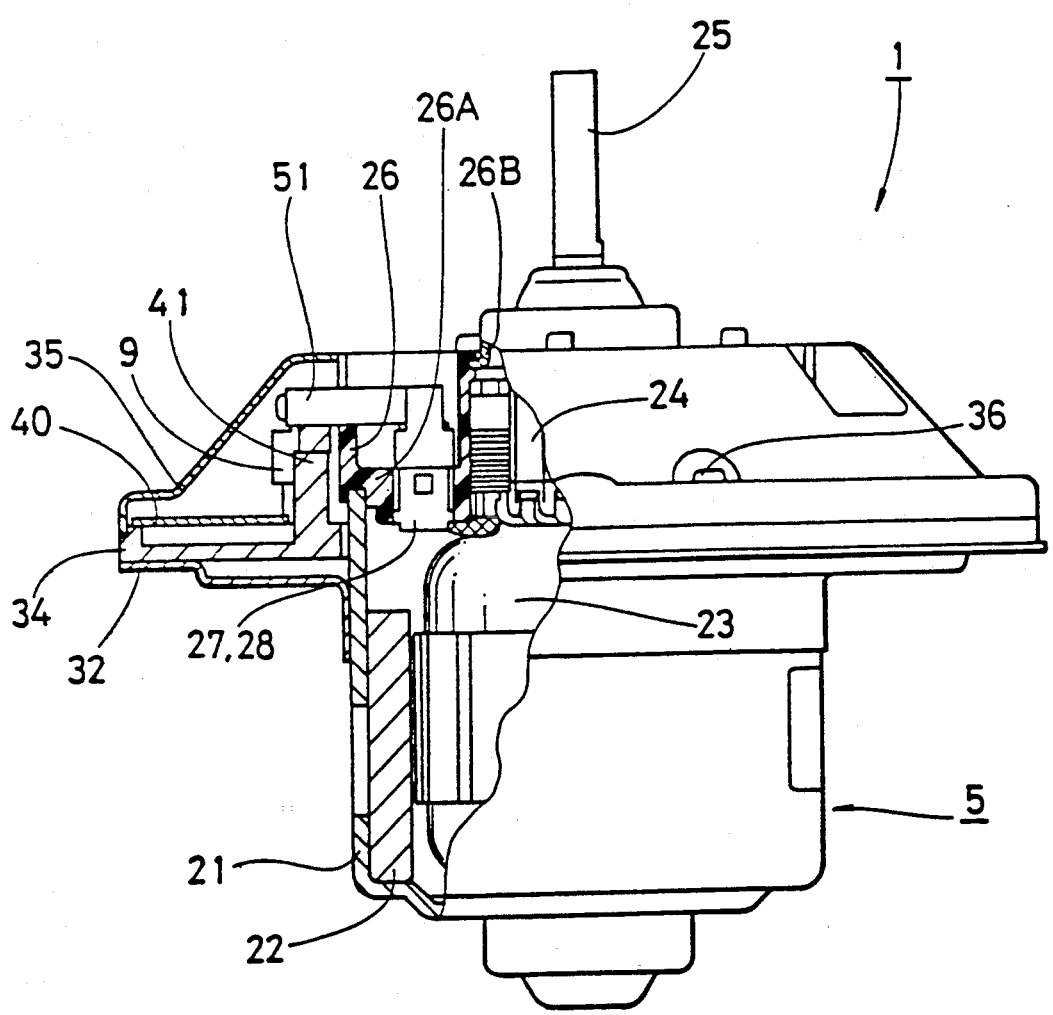
Figure 4:
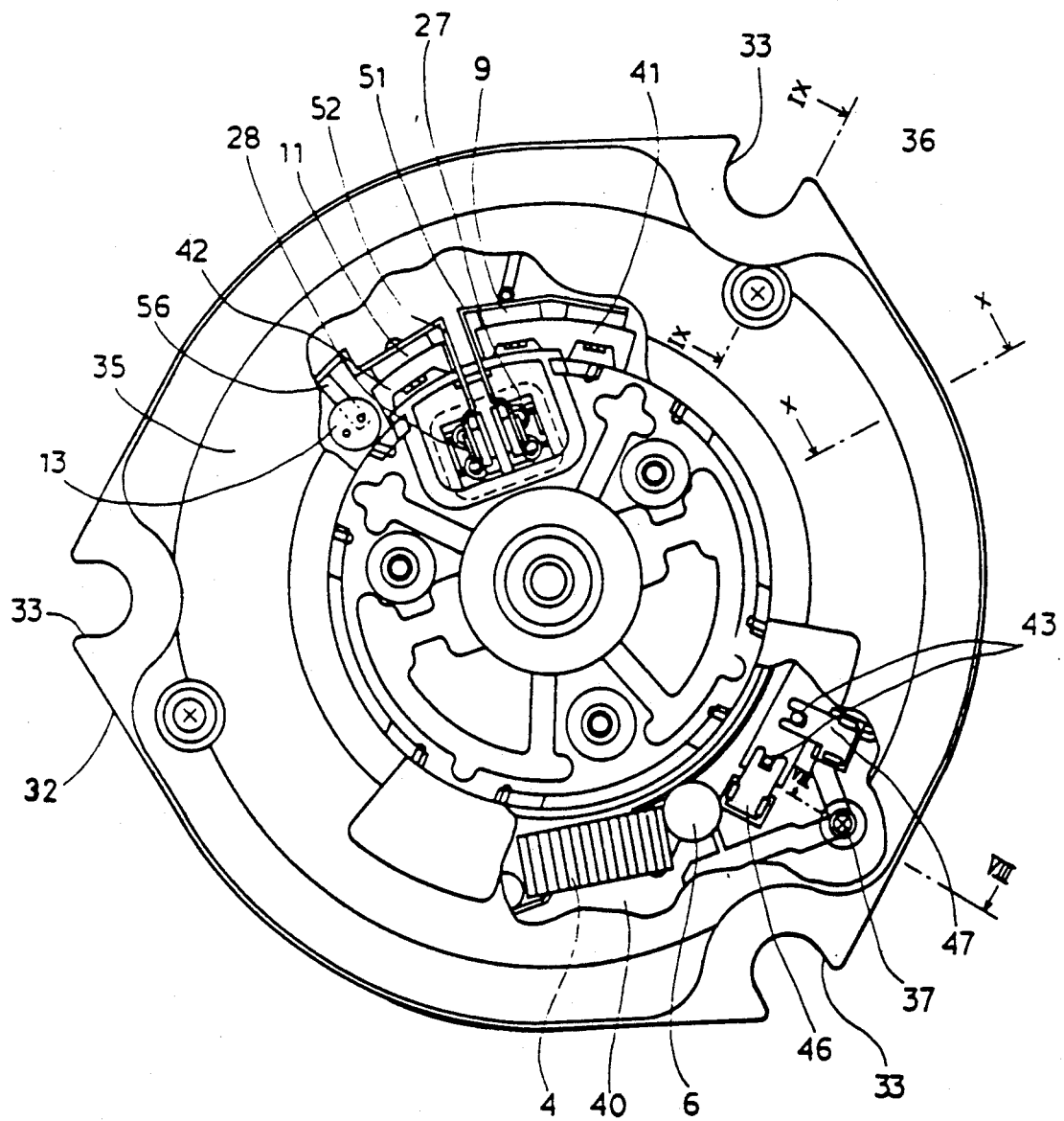

FIG. 3 is a front view of the smart motor 1 of the first embodiment, the smart motor 1 partially broken away. FIG. 4 is a plan view of the smart motor 1. FIG. 1 is a perspective view of the smart motor 1, in which an upper case body is removed.

As illustrated in FIG. 3 the direct current motor 5 is composed of a tubular motor yoke 21, a permanent magnet segment 22 an armature 23, a commutator 24, an output shaft 25, and an end face plate 26 covering an upper face of the motor yoke 21. The end face plate 26 is composed of a connector portion 26A and a plate portion 26B made of a resin. The motor terminals 27 and 28 made of a metal plate penetrate the connector potion 26A, so that the connector portion 26A is molded. Pigtails of brushes housed in a brush holder are connected with the motor terminals 27 and 28, respectively.

A motor holder 32 having a flange shape and formed of a steel plate is fixedly provided at an outer periphery of the motor yoke 21. The motor holder 32 is a metallic fitting for installing the smart motor 1 in the vehicle air conditioner. As illustrated in FIG. 4, three motor installing holes 33 are provided in the motor holder 32. As illustrated in FIG. 3, a substantially annular lower case member 34 is installed on the motor holder 32. A substantially umbrella-shaped upper case member 35 is fixed on the lower case member 34 by a screw 36 to cover an upper part of the lower case member 34. The lower case member 34 and the upper case member 35 are formed by means of an aluminum die cast or a press. The speed control circuit controlling the rotational speed of the direct current motor 5 is incorporated into an annular space enclosed by upper case member 35, the lower case member 34 and an outside peripheral face of the end face plate 26. That is, as illustrated in FIG. 1 a substantially annular printed circuit board 40 is fixed in an upper face of the lower case member 34 by a screw 37.

As illustrated in FIG. 1, the driving FET 9 and the FW diode 11 are soldered and installed upright on the printed circuit board 40 provided near the motor terminal 27 and 28, respectively. In the meanwhile, projection portions 41 and 42 projecting upward like a wall are formed integrally with the lower case member 34. Radiation fins of two of the driving FET 9 and the FW diode 11 are closely contacted with the projection portions 41 and 42 via an insulation plate such as a thin mica plate and are screwed in the projection portions 41 and 42 by a screw. Two of the power MOSFET are connected in parallel with each other because the driving FET 9 switches the high current of more than 30 A.

Power input terminals 46 and 47, illustrated in FIG. 4, are adapted to be connected with the battery 2 by a lead wire 43 which is caulked to be connected with the power input terminals 46 and 47 and is soldered in the terminals 46 and 47 (see FIG. 2).

Figure 5:
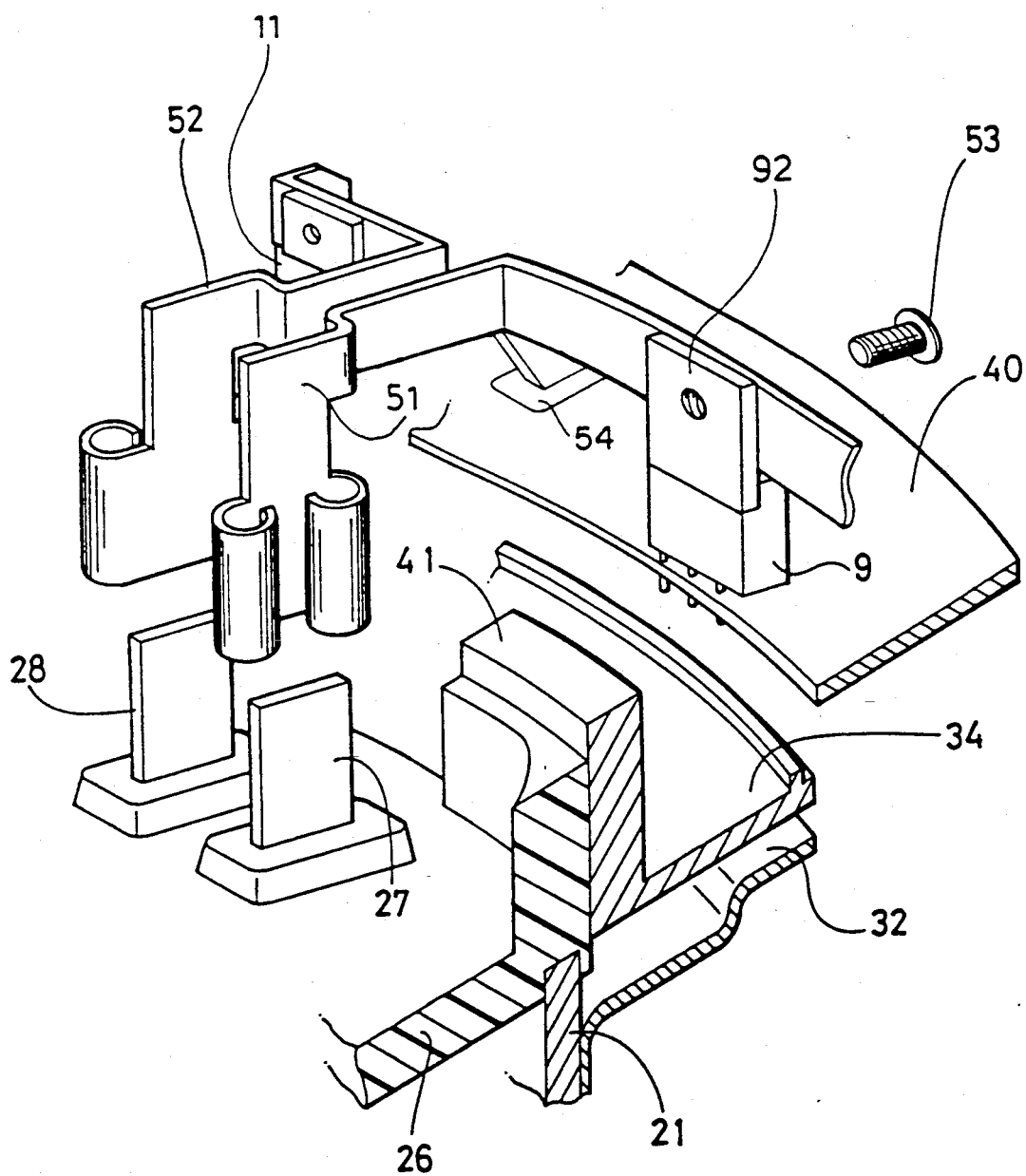

FIG. 5 is an exploded view in perspective of a connection portion between the driving FET9 and the motor terminals 27 and 28.

The motor terminals 27 and 28 are composed of plate-shaped male connectors and are provided in the end face plate 26 in such a state that the connection portion of the motor terminals 27 and 28 project upward. The driving FET9 is soldered upright on the printed circuit board 40. A radiation fin 9a acting as the radiation portion of the driving FET9 is electrically common to the drain D. The radiation fin 9a and the motor terminal 27 are connected by a female connector 51 having a L-shaped conductor. That is, the motor terminal 27 acting as the male connector is equipped with the female connector 51, so that an L-shaped conductor portion of the female connector 51 is positioned in the radiation fin 9a of the driving FET9 provided on the printed circuit board 40 screwed on the lower case member 34. The L-shaped conductor and the radiation fin are closely contacted integrally with each other and are screwed and fixed in the projection 41 of the lower case member 34 by a screw 53 via the thin mica plate (not illustrated), so that the female connector 51 and the driving FET 9 are fixed and the motor terminal 27 and the driving FET9 are electrically connected with each other (see FIG. 5).

The motor terminal 28 is the same male connector as above mentioned terminal 27. The motor terminal 28 is equipped with the female connector 52 fixed on the printed circuit board 40 from upward, so that the motor terminal 28 and a pattern 56 provided on the print-circuit board 40 are electrically connected with each other.

Figure 6:
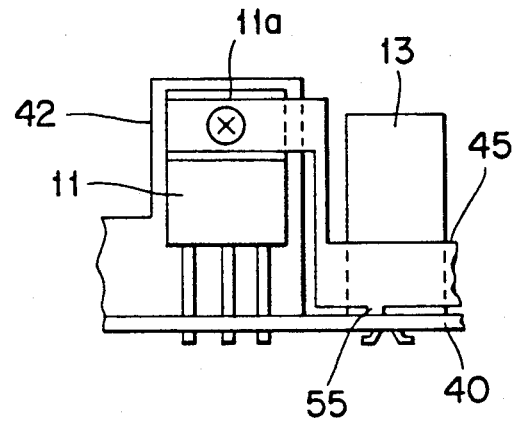
Figure 7:
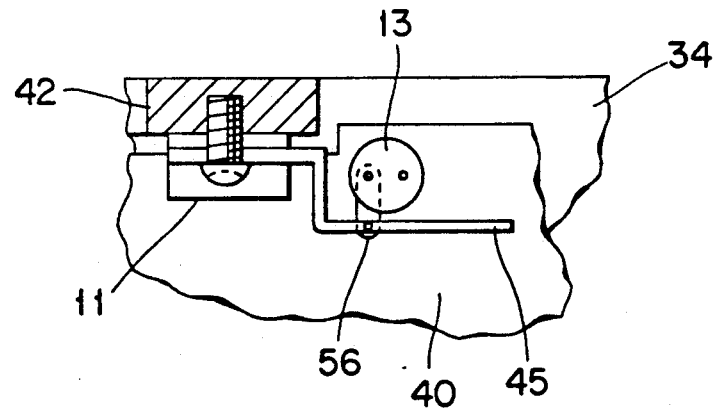

FIG. 6 is a front view illustrating a connection portion between the FW diode 11 and the metal plate 45. FIG. 7 is a plan view illustrating the above connection portion. A radiation fin 11a of the FW diode 11 is electrically common to a cathode terminal. The metal plate 45 is closely contacted with the radiation fin 11a and is installed integrally with the projection 42 of the lower case member 34 by a screw. In the metal plate 45 which is provided upright on the printed circuit board 40, the projection 55 provided in a lower end of the metal plate 45 is inserted into a through-hole conductor of the printed circuit board 40 and is soldered therewith, so that the projection 55 is fixed in the printed circuit board 40 and is connected with the pattern 56. As a result thereof, the metal plate 45 is connected with the high-capacity electrolytic condensers 13 by the patterns 56.

Figure 8:
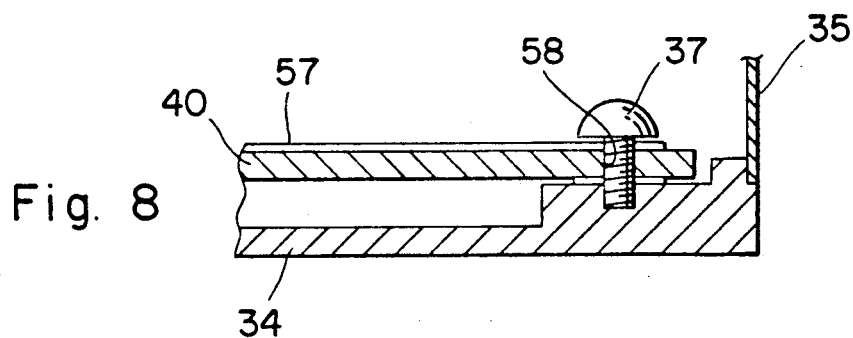
Figure 9:
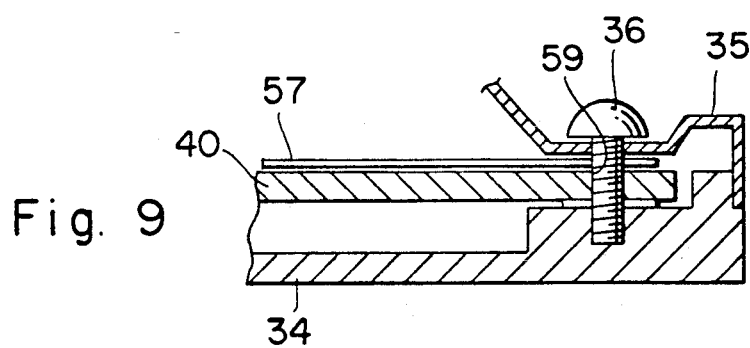
Figure 10:
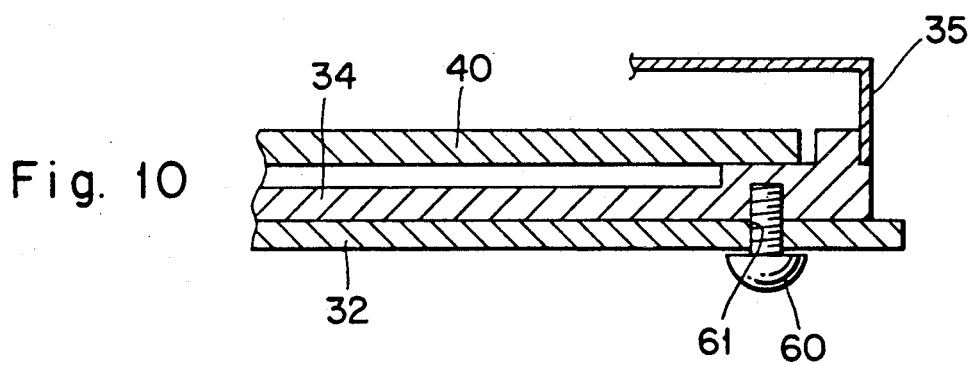

FIGS. 8 to 10 are sectional views illustrating a mutual installation of the motor holder 32, the lower case member 34, the upper case member 35 and the printed circuit board 40. FIG. 8 is a sectional view taken taken on line VIII—VIII of FIG. 4. FIG. 9 is a sectional view taken on line IX—IX. FIG. 10 is a sectional view taken on line X—X.

As illustrated in FIG. 8, the through-hole conductor 58 conducting to a ground pattern 57 is provided in the printed circuit board 40. The print-circuit board 40 is screwed and installed in the lower case member 34 formed of the aluminium die cast by the screw 37 inserted into the through-hole conductor 58. As a result thereof, the lower case member 34 is connected electrically to the ground pattern 57 by the screw 37.

As illustrated in FIG. 9, the upper case member 35 is installed in the lower case member 34 by the screw 36. A through-hole conductor 59 inserting the screw 36 is provided in the printed circuit board 40 so as to conduct to the ground pattern 57. The screw 36 is screwed into a screw hole of the lower case member 34 via the through-hole conductor 59 from above the upper case member 35. The upper case member 35 is screwed in the lower case member 34 by the screw 36. As a result thereof, the upper and the lower case members 35 and 34 are kept conducting electrically to the ground pattern 57 of the print-circuit board 40.

As illustrated in FIG. 10, further, the lower case member 34 is installed in the motor holder 32 to be formed integral with the motor holder 32 by the screw 60 which is inserted into a hole 61 of the motor holder 32 from below and is screwed into the screw hole provided in a bottom of the lower case member 34. The, the bottom of the lower case member 34 and a top of the motor holder 32 are closely contacted with each other so that the motor holder 32 forming a part of the direct current motor 5 is kept conducting electrically to the lower case member 34 by the screw 60.

As a result thereof, the motor holder 32, the lower case member 34 and the upper case member 35 are installed in the ground pattern 57 of the printed circuit board 40 to conduct electrically to the ground pattern 57.

Figure 11:
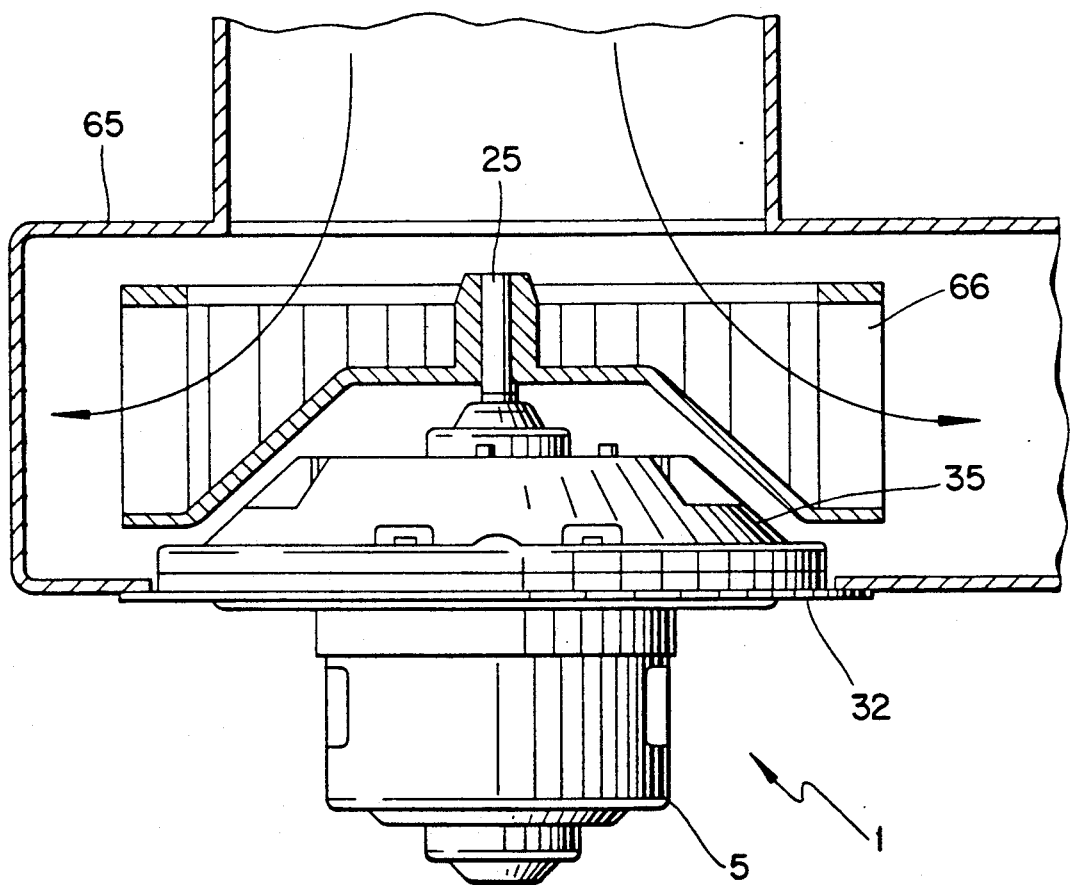

FIG. 11 is a sectional view illustrating the installation of the smart motor 1 constructed as above in an air conditioner. The smart motor 1 is installed in a duct unit 65 and the fan 66 is installed in the output shaft 25 by a screw (not illustrated) inserted into the motor installation hole 33 of the motor holder 32. The speed control circuit provided on the printed circuit 40 provided between the upper case member 35 and the motor holder 32 is positioned in a narrow space between the fan 66 and the direct current motor 5 spaces. An air current blown by the fan 66 is also exposed to the upper case member 35, resulting in a greater cooling effect of the upper case member 35.

In accordance with the above structure, an operation of the first embodiment is explained.

Figure 12:
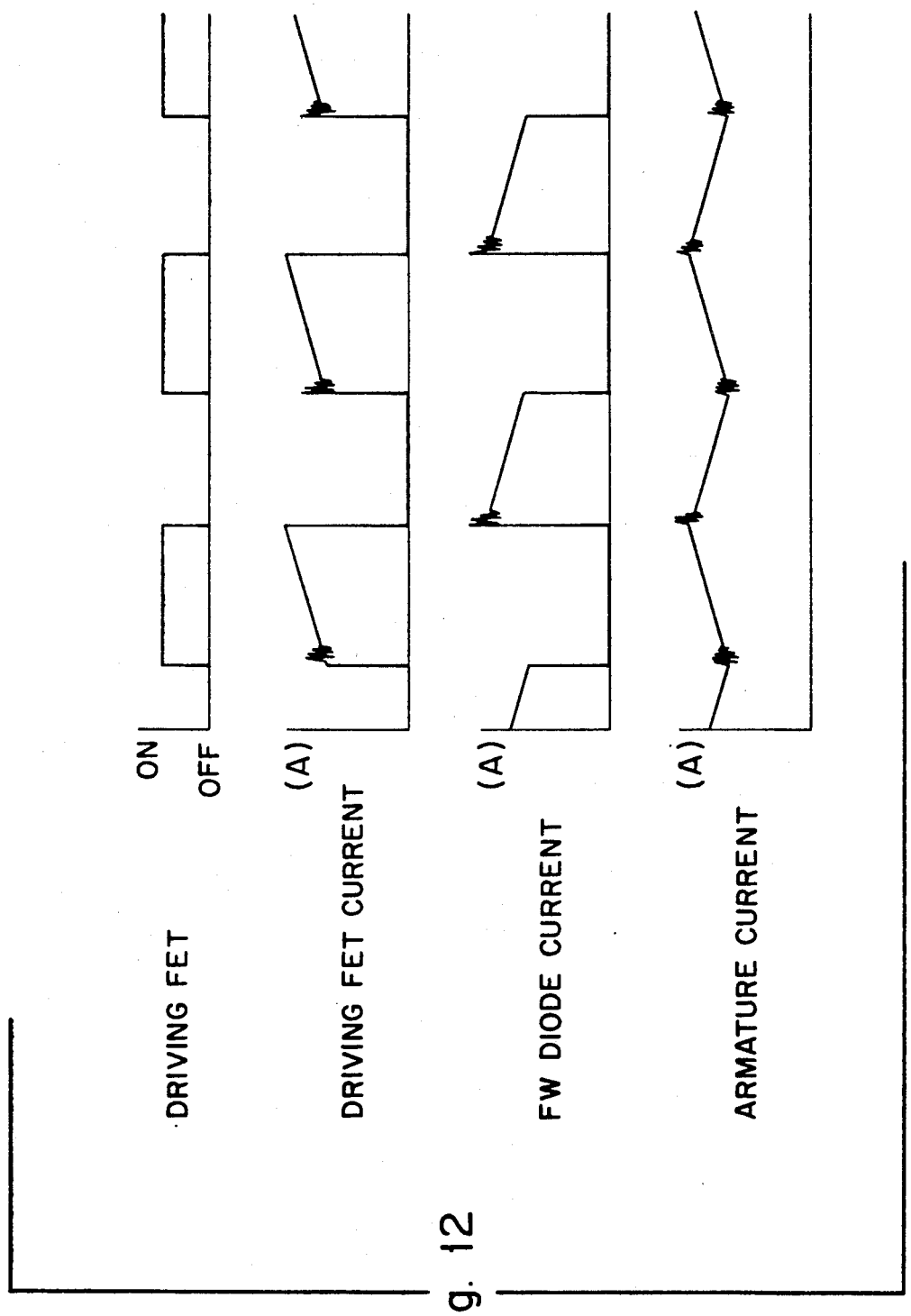

FIG. 12 is a waveform chart illustrating the current of various portions of the speed control circuit generated by the switching of the driving FET9. An armature current becomes a high current of approximately 30 A because a voltage of the battery 2 is 12 V in the blower motor with an output of 300 W, for example. The high current flows in current loops α and γ leading to the driving FET9 when the driving FET9 is ON and flows in current loops β and δ leading to the FW diode when the driving FET9 is OFF. Accordingly, the step-shaped space high current flows in the respective current loop in accordance with ON and OFF of the driving FET9, so that a resonance by a float inductance and a float capacitance of the respective current loop generates a high frequency oscillation and a spike-shaped oscillation voltage between a power line 44 tB and a ground line 44 GND when the current is switched (see FIG. 2).

The above high frequency oscillation of voltage and current has a frequency component of the radio frequency and causes a conducted noise exerting an influence on other apparatuses via electric wires and a radiated noise radiating a harmful electromagnetic wave. In the embodiment an operation of reducing the radio noise is explained.

As illustrated in FIG. 5, in the first embodiment the driving FET9 is provided near the motor terminal 27, and the driving FET9 and and the motor terminal 27 are connected directly with each other by the female connector 51. The FW diode 11 is also disposed near the motor terminal and 28 (see FIG. 4). The current loops in which the high frequency oscillation current flows, namely the current loops α and γ leading to the driving even if the high frequency oscillation generates in the current when the driving FET9 is switched, the frequency of the high frequency oscillation current is low. Accordingly, the four current loops act as antennas to reduce the energy of the radiated electromagnetic wave and the radio noise.

The small geometrical shapes of the four current loops decreases the float inductance of the current loop, thereby resulting in decreasing the high-frequency oscillation current.

Further, because the driving FET9 is connected directly with the motor terminal 27 by the female connector 51 (see FIG. 5), the float inductance by a connection between the motor terminal 27 and the drain terminal of the driving FET9 is extremely small. Accordingly, the oscillation voltage and current of the voltage between the drain and the source generated by the float inductance and the float capacitance between the drain and the source of the driving FET9 become low and the energy of the high frequency oscillation decreases, thus reducing the radio noise.

Figure 13:
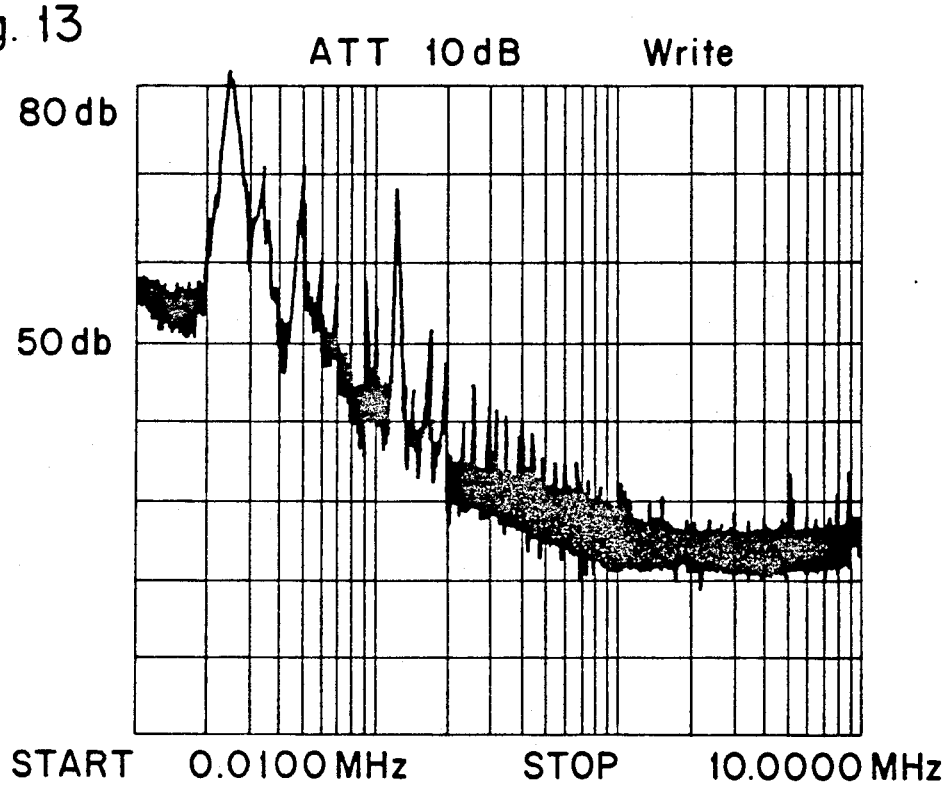
Figure 14:
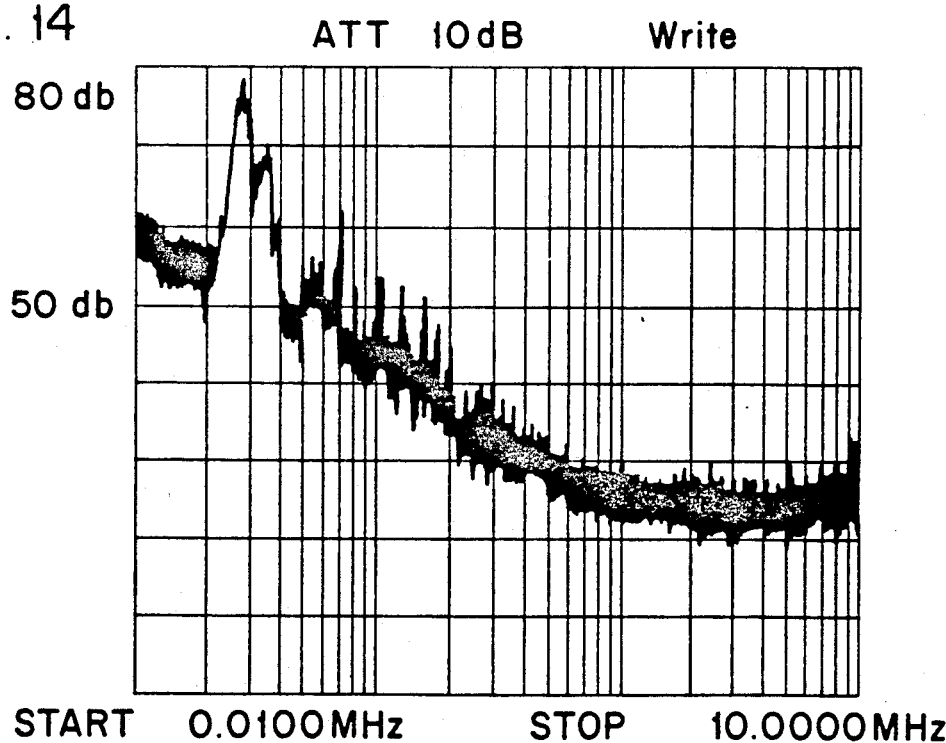

FIGS. 13 and 14 are characteristic views illustrating an effect which the first embodiment produced on the decrease of the radiated noise. FIG. 13 illustrates the radio noise in a first comparison example in which a connection of the motor terminals 27 and 28 and the speed control circuit is long without using the female connector 51 and 52. FIG. 14 illustrates the radio noise in the first embodiment of the invention in which the motor terminals 27 and 28 are connected directly with the driving FET9. A value of the radio noise was measured by means of an antenna located at intervals of 1 m from the smart motor 1.

The above two views shows that there is a great decrease of substantially 10 dB in the radio noise in a frequency range of 0.02 to 0.8 MHz.

Figure 15:
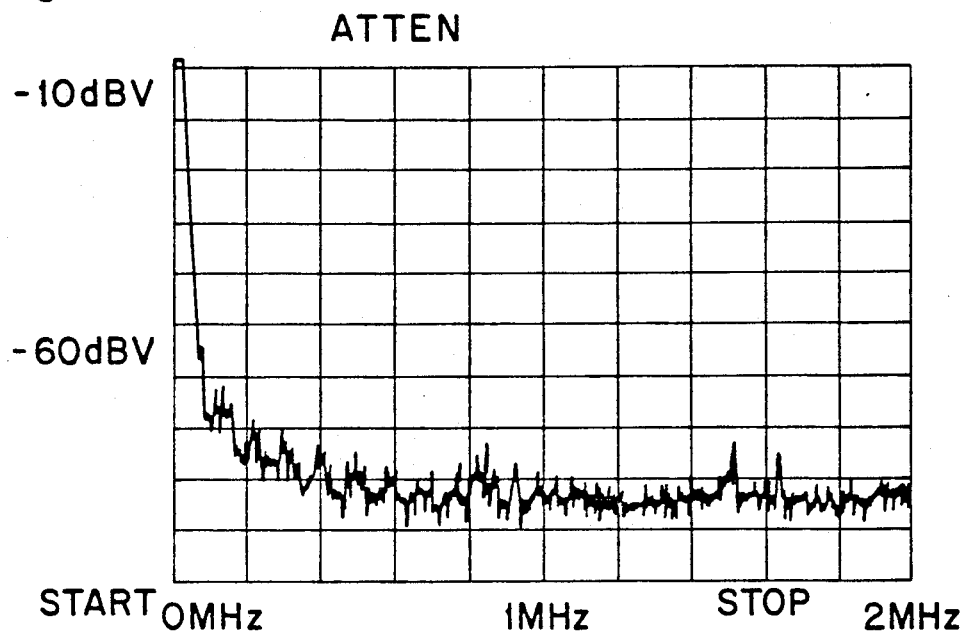
Figure 16:
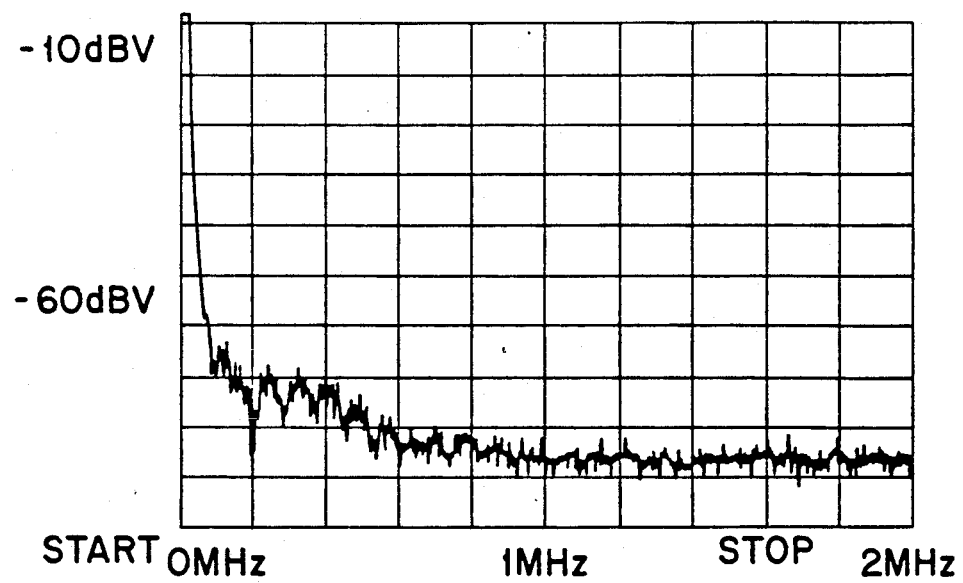

FIG. 15 illustrates the radio noise in a third comparison example in which the motor holder 32 is not grounded. FIG. 16 illustrates the radio noise in the first embodiment in which the motor holder 32 is grounded. Grounding the motor holder 32 results in a decrease of the radio noise in the frequency range of 0.2 to 2 MHz.

As illustrated in FIG. 2, in the first embodiment the LC filter circuit 8 is provided in the power input portion and the high capacity electrolytic condenser 13 is provided between the cathode side of the FW diode 11 and the ground line 43 GND.

The high capacity electrolytic condenser 13 controls a spike voltage and absorbs a counter-electromotive force of the direct current motor 5 when the driving FET9 is switched, thereby controlling generation of the various noises. Also, the LC filter circuit 8 controls the radio noise conducting outside the LC filter circuit 8 via an wire connected with the battery 2 by means of acting with the electrolytic condenser 13.

The LC filter circuit 8 provides the inductance coil only on a side of a non-ground line 44 (or the power line 44), therefore an electric potential of the ground line GND provided inside the speed control circuit is stabilized and the radio noise is decreased.

The operation of reducing the radio noise was explained above. The first embodiment has the following advantage besides the above operation. As illustrated in FIGS. 1 and 3 in the first embodiment the aluminium die cast is used as the lower case member 34 supporting the printed circuit board 40 and the projections 41 and 42 are provided in the lower case member 34 to be used as heat sinks of the driving FET9, and the FW diode 11. Thereby, the entire lower case member 34, which has a large shape and has a high heat capacity and has a large surface area acts as the heat sink, which results in a great improvement in terms of radiating the heat in comparison with heat sinks provided separately in the driving FET9, the FW diode 11. Also, the use of aluminum material, which conducts heat and electricity well, for the lower case member 35 further aids in radiating the heat.

Also, the speed control circuit 40 including the power elements of the driving FET9 and the FW diode 11 are provided on the lower case member 34 so that the direct current motor 5 and the speed control circuit can be built separately. In this manner the advantage of a simplified manufacturing process is obtained.

As illustrated in FIG. 5, in the first embodiment, the male connectors are used as the motor terminals 27 and 28 and the motor terminals 27 and 28 are adapted to be connected with the speed control circuit provided on the printed circuit board 40 by the female connectors 51 and 52 fixed in the FW diode 11 and the driving FET9. Thus the installation of lower case member 34 in the motor holder 32 both integrates the printed circuit board 40, upon which is composed the speed control circuit, with the separately built direct current motor 5 and also connects male connectors 27 and 28 with female connectors 51 and 52. This simplifies the installation operation in that a separate connection operation is not needed. Further, disassembling the direct current motor 5 and the print-circuit board 40 is simplified and the lower case member 34 and the print-circuit board 40 composing the speed control circuit can be exchanged as a unit, which leads to simplified maintenance.

In the first embodiment, various considerations are given because the speed control circuit is incorporated into a narrow space between the fan 66 and the direct current motor 5. That is, as illustrated in FIGS. 1 and 3, the driving FET9, and the FW diode 11 are adapted to be provided upright on the printed circuit board 40 and to be in close contact with the direct current motor 5, thereby reducing space.

In the first embodiment explained above, the speed control circuit is located in the narrow space between the direct current motor 5 and the fan 66 (see FIG. 11). However, various installation positions of the speed control circuit may be contemplated in which the smart motor 1 may be incorporated.

Figure 17A:
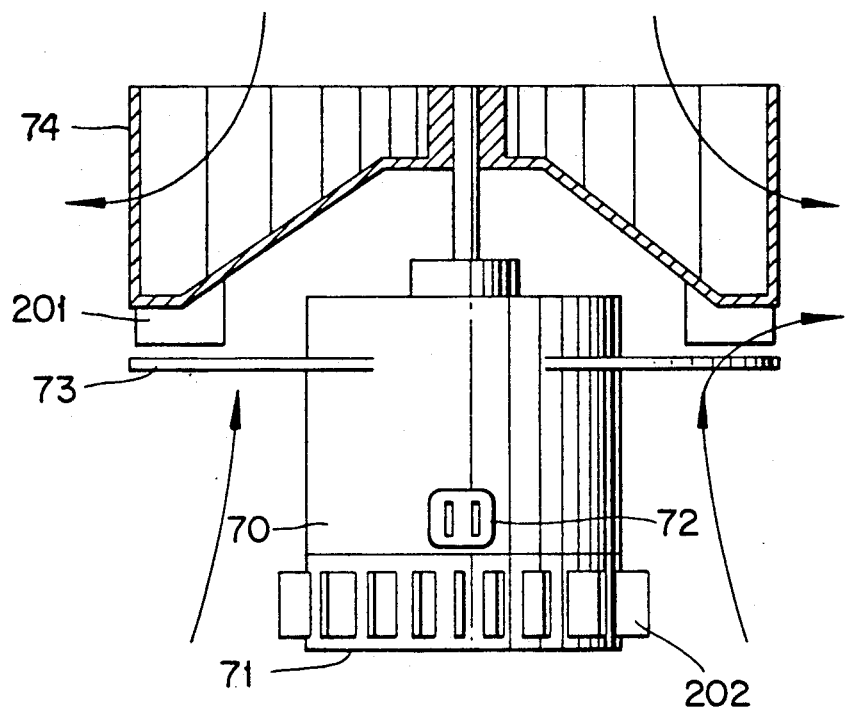
Figure 17B:
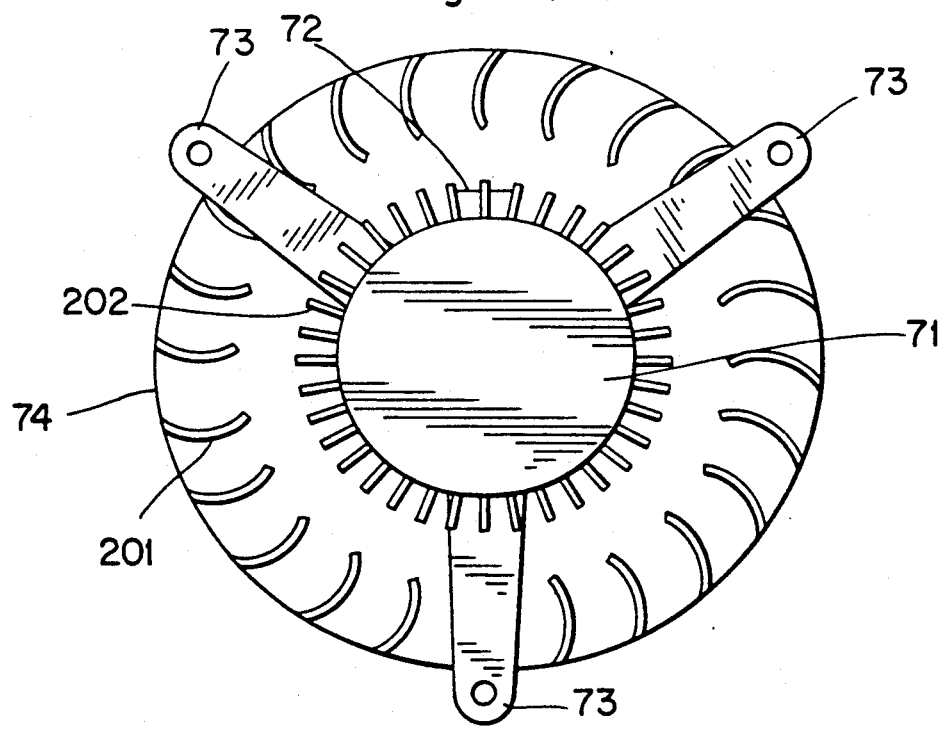
Figure 18:
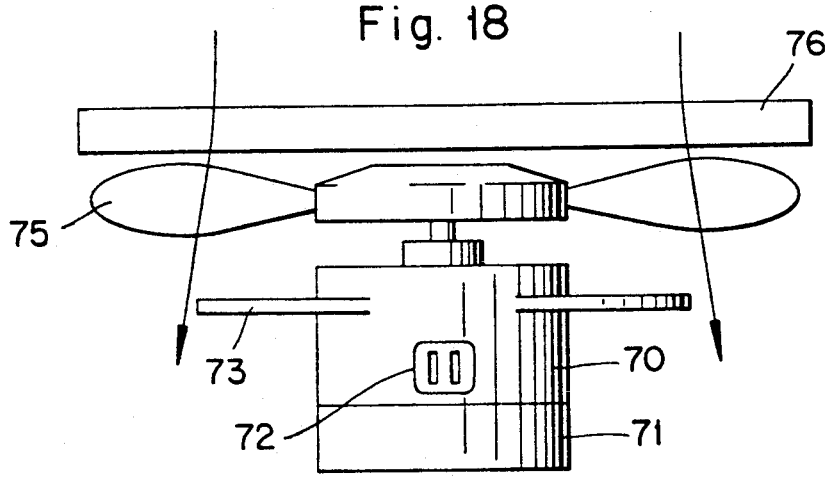

For example, air also travels in an axial direction along the periphery of the direct current motor 70 in a double intake blower motor of the second embodiment of the invention, as illustrated in FIGS. 17(a) and 17(b) and a motor for cooling a radiator of the third embodiment as illustrated in FIG. 18. The speed control circuit 71 is incorporated into the motor end of the reverse side of the output shaft of the direct current motor 70, thereby allowing an effective cooling of the control motor. Also, if a radiation fin 202 is formed in a surface of the case member of the speed control circuit 71, the cooling effect can be further enhanced (see FIGS. 17(a) and 17(b). When the speed control circuit 71 is provided on the motor end, it is desirable to provide a commutator in the motor end side and provide the motor terminal 72 near the motor end so as to reduce the current loop and the radio noise. In FIGS. 17(a), 17(b) and 18, numeral 73 designates the motor holder, numerals 74 and 75 designate the fans, numeral 201 designates an auxiliary fan fixedly provided in a lower face of fan 74 and numeral 76 designates the radiator.

Figure 19:
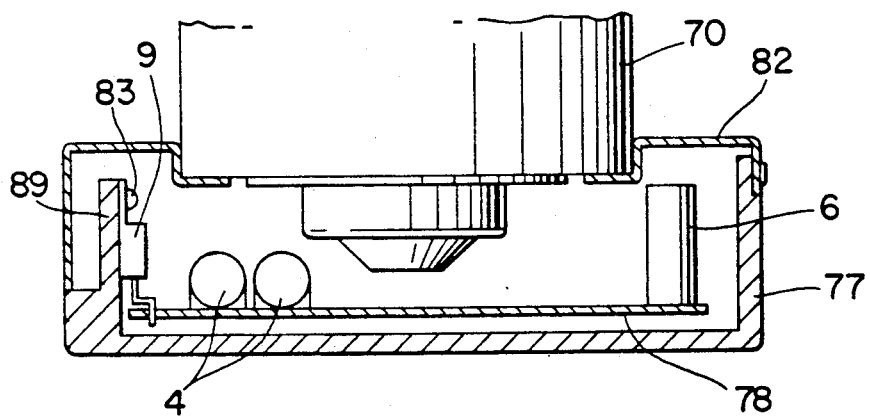

In the fourth embodiment, as illustrated in FIG. 19, a printed circuit board 78 is incorporated into a cylindrical lower case member 77 having a bottom and is installed in the motor end of the direct current motor 70. The case member 77 is formed of the aluminium die case and is provided partially with a projection 89 having a side wall shape and is used as the heat sink of power elements of the driving FET9 and FW diode 11. The power elements 9 and 11 are installed upright in the projection 89, so that a surface of the printed circuit board 78 can be utilized effectively and so that the current loops α to δ (see FIG. 2) of the speed control circuit including the power elements can be reduced in size. This structure allows concentration of the elements having a high current. Numeral 82 designates a cover member, numeral 83 designates a screw for fixing the driving FET9 (see FIG. 19).

Figure 20:
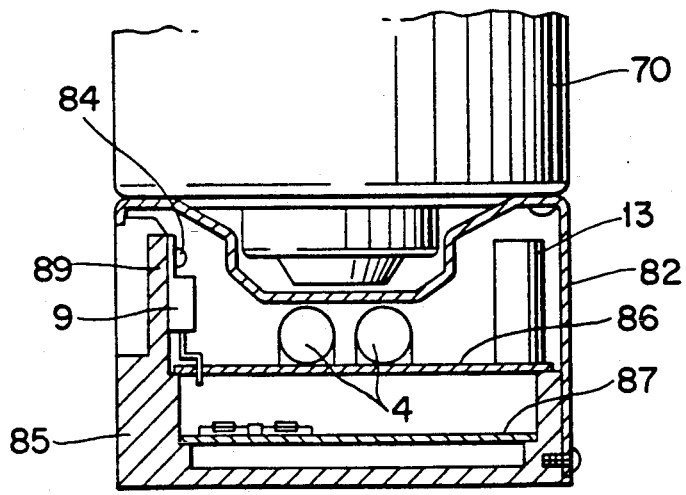

In a fifth embodiment, as illustrated in FIG. 20, the case member 85 is installed in the motor end of the direct current motor 70 and a diameter of a case member 85 is reduced to be substantially identical with that of the direct current motor 70 and two layers of the print-circuit boards 86 and 87 are provided in the case member 85. The power elements in which the high current of the FW diode 11 flows are collected in the printed circuit board 86 of an upper layer and the speed control circuit portions of a low current signal are collected in the printed circuit board 87 of the lower layer. Thus, the print-circuit boards 86 and 87 are provided separately in the case member 85. The outer diameter of the case member 85 is reduced to facilitate the loading of the smart motor in the vehicle and to decrease the size of current loops α to β of the speed control circuit which include the power elements. The radiation fin of power elements such as the driving FET9 and FW diode 11 is closely attached to the projection 89 of the case member 85 by the screw 84.

If the case members 77 and 85 are installed in the motor end of the direct current motor via the cover member 82 as in the fourth and the fifth embodiments as illustrated in FIGS. 19 and 20, respectively, and as in the sixth and seventh embodiment as illustrated in FIGS. 21 and 22, a screw hole 96 is formed in the motor yoke 21 of the direct current motor 70 and the cover member 82 is screwed directly in the motor yoke 21 by the screw 97, so that the motor yoke 21 of the direct current motor 70 conducts electrically to the cover member 82. In the first embodiment the through-hole conductors 58 and 59 are used to connect the ground pattern 57 and the lower case member 34 on the print-circuit board 40. The use of the both structures illustrated in FIGS. 8 and 9 allows simplification of the grounding structure. An eighth embodiment, illustrated in FIG. 22, shows the cover member 82 fixed in the motor yoke 21 by a rivet 98.

In the first embodiment and the fifth to the sixth embodiments the power elements, such as the FW diode 11, are provided upright on the print-circuit boards 40, 78, and 86. However, as in the ninth embodiment as illustrated in FIG. 23 stepped projections 99 may be provided in the lower case member 34 and the case members 77, 85 and 90 upon which to lay power elements such as the driving FET9 and the FW diode 11.

In FIGS. 1, 5, and 6, the projections 41, 42, and 89 with which the radiation fin of the power elements such as the driving FET9 and the FW diode 11 are closely contacted are formed integrally with the case members 34, 77, and 85, by the aluminium die cast. However, only the projections 41, 42, and 89 may be formed of a block-shaped good conductor of heat and be closely contacted integrally with the case members 34, 77, and 85.

In the first embodiment, as illustrated in FIGS. 8 to 10, the print-circuit board 40 is installed in the lower case member 34 by the screw 37 and the print-circuit board 40 and the lower case member 34 are installed in the upper case member 35 by the screw 36 and the motor holder 32 is installed in the lower case member 34 by a screw 60. In the ninth to the eleventh embodiments, as illustrated in FIGS. 24, 25 and 26, projections 101, 102 and 103 may be provided in the lower case member 34 and be inserted into the through-hole conductors 58 and 59 and the hole 61 of the motor holder 32 and be caulked to fix the print-circuit board 40 and the lower case member 34 mutually.

Figure 27:
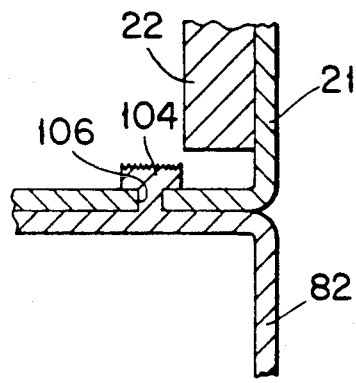
Figure 28:
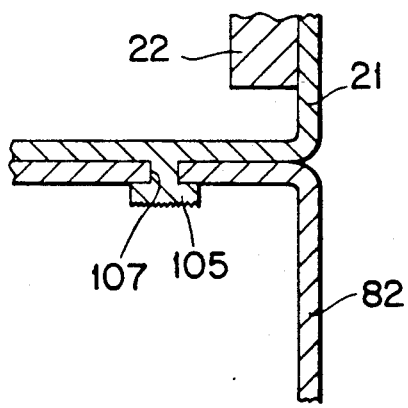
Figure 29:
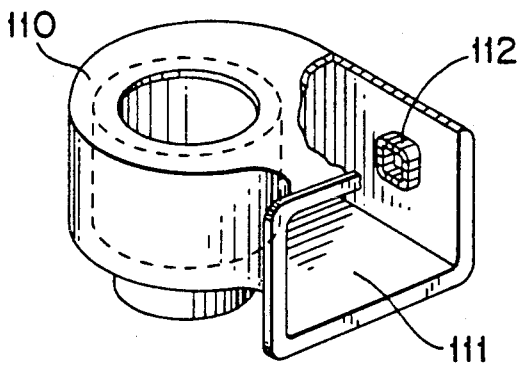
FIG. 29 is a perspective view illustrating a fan device equipped with a conventional motor, the fan device being partially broken away.
Figure 30:
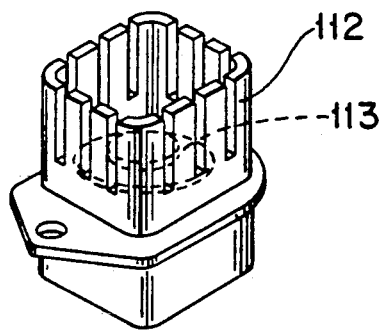
FIG. 30 is a perspective view, on an enlarged scale, of a portion of the conventional fan device.

In the same way, in twelfth and thirteenth embodiments, as shown in FIGS. 27 and 28, projection 104 provided in the cover member 82 may be inserted into hole 106 and projection 105 provided in the motor yoke 21 may be inserted into a hole 107 and the projections 104 and 105 may be caulked to fix the motor yoke 21 and the cover member 82.

As illustrated in FIG. 5, in the first embodiment the detachable female connectors 51 and 52 are used to connect the driving FET9 and the FW diode 11 with the motor terminals 27 and 28. However plate-shaped terminal metal fittings may be soldered and connected directly with the motor terminals 27 and 28, thereby also allowing reduction of the radio noise.

Further, the motor terminal 27 may be formed into a L-shaped member and the radiation fin 9a of the driving FET9 may be adapted to be screwed directly in the motor terminal 27.

When the female connectors 51 and 52 are used as the terminal metal fittings, the female connectors can be used as the motor terminals 27 and 28 and the male connectors can be used as the connectors 51 and 52.

The control motor of the invention provides a projection which is formed integrally with the case member formed of the material which conducts heat well and is used as the heat sink of the power terminal, which results in a great deal of heat being radiated. Further, the case member performs the function of the electromagnetic shield, reducing the radio noise.

In the control motor of the invention, the entire speed control circuit, including the power elements such as the switching element, is provided on the case member, therefore assembling the speed control circuit in manufacturing and disassembing it in maintenance are easy. In the control motor, the through-hole conductor is used to conduct the ground pattern of the print-circuit board and the case member. This facilitates keeping the case member grounded. Further, this results in promoting the electromagnetic shield function of the case member, thereby reducing the radio noise.

In the control motor, the case member is kept conducting to the speed control circuit and is fixed in the direct current motor by the metallic fixing means. In the control motor, and outer shell of the direct current motor is grounded and the electromagnetic shield function is improved, reducing the radio noise.

In the control motor of the invention, the switching element and the motor terminal are connected directly by the terminal metallic fittings, therefore there is an advantage in that the geometrical shape of the current loops become small, reducing the radio noise greatly.

In the control motor in which the female and the male connectors are used as the motor terminal and the terminal metallic fittings, the direct current motor and the speed control circuit can be easily disconnected and connected while the above advantage is kept. Therefore, the direct current motor and the speed control circuit can be manufactured by means of a separate installation and the installation can be simplified. Also, separate maintenance of the direct current motors and the speed control circuit is possible.

The control motor of the invention provides the LC filter circuit having the inductance only on the non-ground line and the high capacity electrolytic condenser connected with the cathode side of the free wheel diode. Therefore, there is an advantage in that the generation and the radiation of the radio noise are reduced and the noise generating inside the speed control circuit reduces the radio noise conducting outside the LC filter circuit via the power source line.

What is claimed is:

1. A control motor comprising an integrated direct current motor and speed control circuit, said speed control circuit controlling a rotational speed of said direct current motor by means of changing a voltage applied to an armature of said motor by a chopping of a switching element, said speed control circuit being composed upon a printed circuit board which is supported in said direct current motor by a case member formed of a heat-conducting material, and a radiation portion of said switching element which is in close contact with a projection formed integrally with said case member and is installed in said projection.

2. The control motor in claim 1, wherein said printed circuit board has a through-hole conductor conducting to a ground pattern and said printed circuit board is installed in said case member by a conductive metallic installing means inserted into the through-hole conductor.

3. The control motor in claim 2, wherein said case member is kept conducting electrically to said ground pattern and is fixed in a yoke of said direct current motor by a conductive metallic fixing means.

4. The control motor as defined in claims 1 or 3, wherein said case member comprises a lower case member in which said printed circuit board is fixed, and an upper case member which is formed of an electrically conductive material and covers said speed control circuit.

5. The control motor as defined in claim 1, wherein the switching element which switches on and off a current flowing in said direct current motor is provided near a motor terminal connected with a brush and fixedly installed in said direct current motor and a radiation fin of the switching element is directly connected to the motor terminal by a terminal metal fitting.

6. The control motor defined in claim 5, wherein said motor terminal is composed of either a male or a female connector and said connector is composed of either a female or the male connector corresponding to a male or a female of said motor terminal and said switching element is connected with said motor terminal by either the male or the female connector provided in said switching element.

7. The control motor as defined in claim 1, wherein said speed control circuit provides an LC filter circuit provided in a power source input portion and having an inductance only on a non-ground line side, said switching element switches on and off the current flowing to said direct current motor, a free wheel diode connected in parallel with said direct current motor, and a high capacity electrolytic condenser connected between a cathode side of said free wheel diode and the ground line.

* * * * *